United States Patent [19]

Takemae

[11] Patent Number: 4,646,118
[45] Date of Patent: Feb. 24, 1987

[54] SEMICONDUCTOR MEMORY DEVICE

[75] Inventor: Yoshihiro Takemae, Tokyo, Japan

[73] Assignee: Fujitsu Limited, Kawasaki, Japan

[21] Appl. No.: 681,290

[22] Filed: Dec. 13, 1984

[30] Foreign Application Priority Data

Dec. 13, 1983 [JP] Japan ............................ 58-233554

[51] Int. Cl.⁴ .................... H01L 29/78; H01L 27/02
[52] U.S. Cl. ................................. 357/23.6; 357/41; 357/51; 357/55; 357/23.1
[58] Field of Search .............. 357/23.6, 23.1, 41, 357/55, 51; 365/182

[56] References Cited

U.S. PATENT DOCUMENTS

| 4,466,180 | 9/1984 | Soclof | 357/23.6 |
| 4,507,159 | 3/1985 | Erb | 357/23.6 |

FOREIGN PATENT DOCUMENTS

| 0018764 | 11/1980 | European Pat. Off. | |
| 0085988 | 8/1983 | European Pat. Off. | |
| 55-24429 | 2/1980 | Japan | 357/23.6 |
| 56-32757 | 4/1981 | Japan | 357/23.6 |
| 58-2360 | 1/1983 | Japan | 357/23.6 |

OTHER PUBLICATIONS

Patents Abstracts of Japan, vol. 7, No. 72 (E-166) (1217), Mar. 25th, 1983; & JP-A-583260 (Fujitsu K.K.) Jan. 10, 1983, Abstract; figs. 4, 5.
Patents Abstracts of Japan, vol. 5, No. 99 (E-63) (771), Jun. 21, 1981; & JP-A-5643753 (Nippon Denshin Denwa Kosha) Apr. 22, 1981, Abstract; figs. 2a, 4a, 4b.
B. J. Masters: "Reduction of Alpha-Induced Soft Errors In Dynamic Memories" IBM Technical Disclosure Bulletin, vol. 22, No. 8a, Jan. 1980, pp. 3208-3209, Armonk, N.Y., US; p. 3208, paras. 2, 3; figs.

Primary Examiner—Martin H. Edlow
Assistant Examiner—Terri M. Henn
Attorney, Agent, or Firm—Staas & Halsey

[57] ABSTRACT

A semiconductor memory device, such as a MOS dynamic RAM device, having memory cells each comprising a transfer gate transistor and a capacitor. The capacitor is a so-called groove-type capacitor and has a conductive layer formed on an insulation film attached to the inside surface of a groove formed on a semiconductor substrate. The conductive layer is electrically coupled to the source of the transfer gate transistor. The capacitance of the capacitor is formed between the conductive layer and a second conductive layer formed on the conductive layer via an insulation film, and/or between the conductive layer and the semiconductor substrate.

17 Claims, 25 Drawing Figures

SEMICONDUCTOR MEMORY DEVICE

BACKGROUND OF THE INVENTION

The present invention relates to a semiconductor memory device, more particularly, to a semiconductor memory device wherein memory cells are formed of transistors and so-called groove-type capacitors.

In general, in a dynamic-type semiconductor memory device, each memory cell is comprised by a single MOS transistor and a single capacitor. Such a memory cell enables improved integration of the circuit due to the low number of elements used and, therefore, increased storage density. However, the capacitance of each memory cell preferably should be as large as possible since it is necessary to hold stored data stably for as long a period as possible, and large cell capacitance is also required for increasing the immunity against soft error caused by the radiation of alpha particles. Therefore, to further increase the degree of integration of a semiconductor memory device using such memory cells and, therefore, the storage density, it is necessary to use capacitors offering large capacities with small occupied areas as the capacitors of the memory cells.

In a conventional dynamic-type semiconductor memory device, each memory cell is formed of a transfer gate MOS transistor and a capacitor. The capacitor is a so-called groove-type capacitor and is comprised by providing a V-shaped or U-shaped groove on a semiconductor substrate, attaching a thin insulation film on the inside surface of the groove, and forming a polycrystalline silicon layer on the insulation film. The capacitor for storing data includes an inversion layer which is formed along the groove and which is electrically coupled to the source of the transfer gate MOS transistor and the polycrystalline silicon layer, so that a large capacitance is realized in a small cell area.

However, in the above-mentioned conventional memory device, when the distance between the capacitor grooves of adjoining memory cells is too small, the depletion layer formed under the grooves overflows the entire region between the grooves. Therefore, in this case, the punchthrough phenomenon easily occurs in this region and cells become electrically connected, thereby causing the stored information to be destroyed. Thus, in the conventional memory device, it is impossible to reduce the distance between the grooves of the adjacent memory cells and thus to increase the degree of integration of the device.

SUMMARY OF THE INVENTION

In order to solve the aforementioned problems of the conventional memory device, the present invention adopts an idea of forming on an inside surface of a groove a capacitor electrode connected to the source of a transfer gate transistor, for storing electric charges according to the stored data, in a semiconductor memory device provided with memory cells each having a transfer gate transistor and a groove-type capacitor.

It is an object of the present invention to enable reduction of the distance between the grooves of capacitors of adjoining memory cells so as to improve the degree of integration.

It is another object of the present invention to prevent the occurrence of leakage between electrodes of capacitors by stress, etc. induced by heat treatment, etc. so as to improve the reliability and yield of the semiconductor memory device.

According to the present invention, there is provided a semiconductor memory device provided with memory cells each comprising: a transfer gate transistor having a drain, a source, and a gate formed on the channel region between the drain and source via a gate insulation film; and a capacitor having a conductive layer formed on an insulation film attached to the inside surface of a groove formed on a substrate, the conductive layer being electrically coupled to the source of the transfer gate transistor.

DESCRIPTION OF THE PREFERRED EMBODIMENTS

Before describing the preferred embodiments, an explanation will be given of a conventional memory device.

Figure 1:
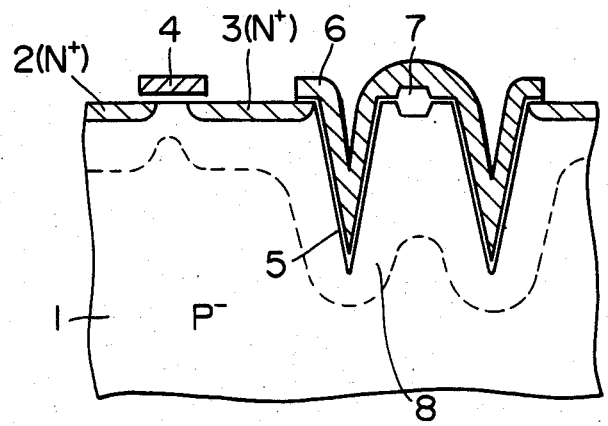
FIG. 1 is a cross-sectional view showing a memory cell in a conventional semiconductor memory device.

FIG. 1 shows a construction of a memory cell used in a conventional dynamic type semiconductor memory device. The illustrated memory cell is formed of a single transfer gate MOS transistor and a single capacitor for each bit. The MOS transistor is comprised, for example, with $N^+$-type diffusion layers 2 and 3 formed on the $P^-$-type semiconductor substrate 1 as its drain and source and with a polycrystalline silicon layer 4 formed on a channel region between the $N^+$-type diffusion layers 2 and 3 via an insulation film (not shown) as its gate. The capacitor is a so-called groove-type capacitor and is formed by a V-shaped groove, for example, on the $P^-$-type substrate 1, with a thin insulation film 5 on the inside surface of the groove, and a polycrystalline silicon layer 6 on the insulation film 5. Reference numeral 7 is a field oxide film for isolation from a capacitor of the adjoining memory cell.

In the memory cell of FIG. 1, one electrode plate of the capacitor is formed by an inversion layer at the surface portion of the V-shaped groove of the $P^-$-type substrate, which can be generated by an introduction of N-type impurity into the surface portion or by application of a positive potential to the conductive layer 6. A capacitance is formed between this inversion layer and the conductive layer 6. Therefore, a capacitor electrode is formed along the V-shaped groove and, thus, it is possible to obtain a large capacitance with a small substrate surface area.

However, in the memory cell of FIG. 1, a depletion layer 8 is formed in the range indicated by the dotted lines. When the distance between capacitor grooves of adjoining memory cells is small, this depletion layer overflows the entire region between grooves and thus the punchthrough phenomenon easily occurs in this region. When the punchthrough phenomenon occurs, the inversion layers formed along adjacent grooves are electrically connected to each other and the stored information is destroyed. Therefore, there is the disadvantage that it is not possible to reduce the distance between grooves and improve the degree of integration of the memory device too much. Further, in the memory cell of FIG. 1, there is the disadvantage that when stress is applied due to heat treatment, dislocation, etc. occurs in the crystals, leakage easily occurs in the groove portions, and information is destroyed.

According to the present invention, there is provided a semiconductor memory device which overcomes there problems.

Figure 2:
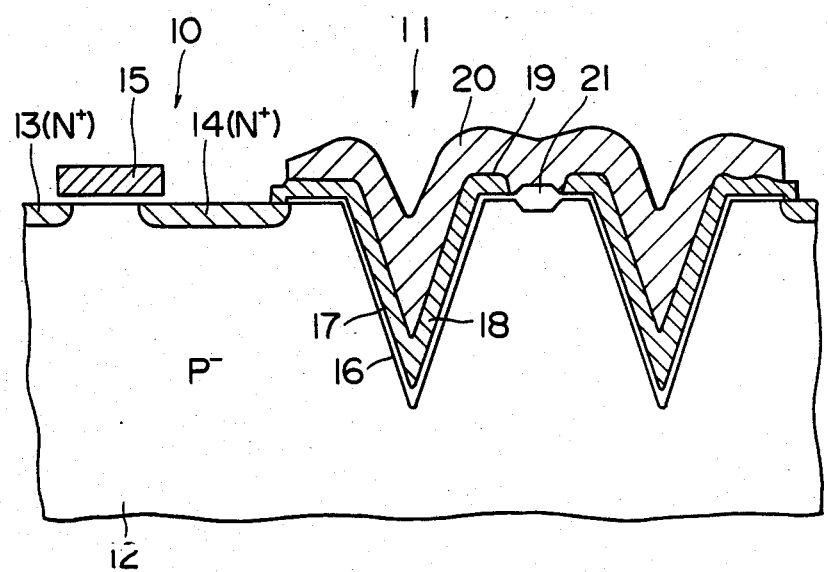
FIG. 2 is a cross-sectional view showing a memory cell in a semiconductor memory device according to an embodiment of the present invention.

Below, a description will be given of an embodiment of the present invention in reference to the drawings. FIG. 2 shows a cross-section of a memory cell used in a semiconductor memory device according to an embodiment of the present invention. The illustrated memory cell is provided with a transfer gate MOS transistor 10 and a groove-type capacitor 11. The MOS transistor 10 is comprised with N+-type diffusion layers 13 and 14 formed on a P−-type semiconductor substrate 12 as its drain and source and with a polycrystalline silicon or other layer 15 formed on a channel region between the N+-type diffusion layers 13 and 14 via an insulation film (not shown) as its gate. The capacitor 11 is formed on an insulation film 17 formed on the inside surface of, for example, a V-shaped groove 16, and is provided with a first conductive layer 18 of polycrystalline silicon, etc. formed on the insulation film 17 and a second conductive layer 20 formed on the conductive layer 18 via an insulation film 19 shown by the solid line. In other words, the capacitor 11 is comprised by the insulation film 19 for a capacitor dielectric sandwiched between the opposing first and second conductive layers 18 and 20. Reference numeral 21 is a field oxide film for isolation between the capacitors of adjoining memory cells. The second conductive layer 20 should be connected to a constant potential terminal, e.g., a ground terminal or a power source terminal so as to function as a common capacitor electrode plate.

In the memory cell of FIG. 2, the gate of the MOS transistor 10, i.e., the conductive layer 15, is, for example, connected to the word line, while the drain, i.e., the N+-type diffusion layer 13, is connected to the bit line. The source, i.e., the N+-type diffusion layer 14, is connected with the first conductive layer 18 of the capacitor 11, while the second conductive layer 20 of the capacitor 11 is connected to the power source, so that when the potential of the word line becomes high level, the MOS transistor 10 turns ON and the capacitor 11 is connected to the bit line for reading and writing of data, i.e., an operation is performed to charge or discharge the capacitor 11.

In the memory cell of FIG. 2, the capacitor electrode plate, which is connected to the source region 14 and which must be electrically isolated from that of the adjacent cell, is thus formed by the first electrode of the capacitor which is completely isolated by the isolation films. Therefore, it is possible to prevent the occurrence of the punchthrough phenomenon between adjoining capacitors and to reduce the distance between the grooves of adjoining capacitors to improve the degree of integration. Further, since the first conductive layer 18 of the capacitor is isolated from the P−-type substrate 12 by the insulation layer 17, even if leakage occurs at the groove portion due to stress induced by heat treatment, etc., this leakage will not result in leakage of the charge of the conductive layer 18, and therefore, there is no destruction of information and it is possible to improve the reliability of the semiconductor memory device.

Figure 3A:
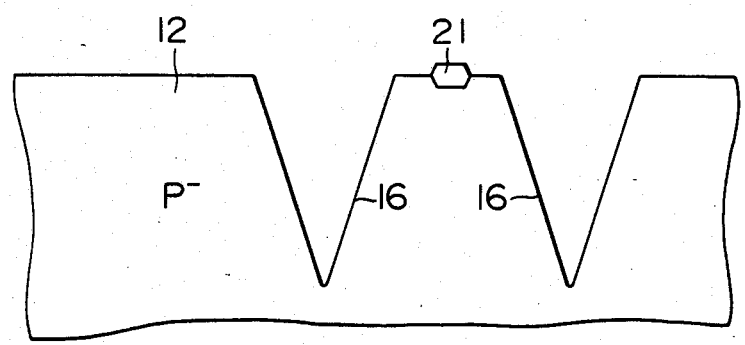
FIG. 3A to FIG. 3E are views of the fabrication process for explaining the method of fabrication of the memory cell of FIG. 2.

Next, an explanation will be given of a method for manufacturing the memory cell of FIG. 2 in reference to FIG. 3A to FIG. 3E. First, on the semiconductor substrate 12, as shown by FIG. 3A, is formed a field oxide film 21 which isolates the capacitors of adjoining memory cells, then reactive ion etching, etc. is performed for formation of, for example, the V-shaped groove.

Figure 3B:
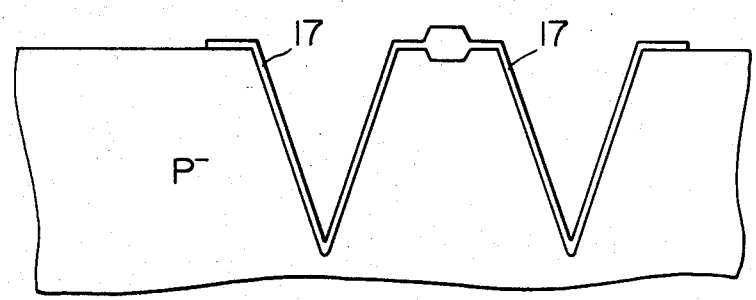

Next, as shown by FIG. 3B, an insulation film 17 is formed on the inside surface of the groove 16. This insulation film 17 is first attached to the substrate surface and the entire surface of the groove 16, then photomasks, etc. are used for patterning so as to form the insulation layer 17 as shown by FIG. 3B.

Figure 3C:
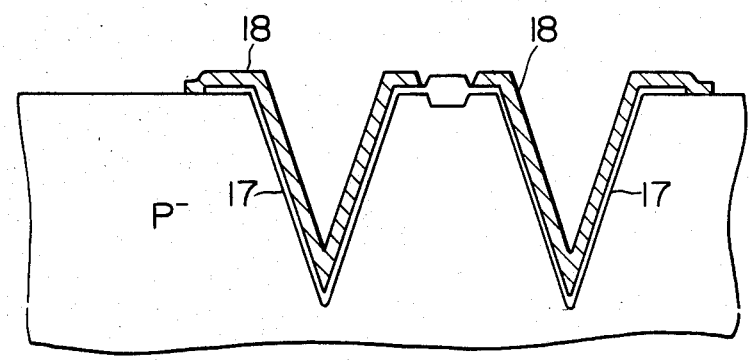

Next, as shown in FIG. 3C, a first layer polycrystalline silicon layer 18 is formed on the insulation film 17, etc. The polycrystalline silicon layer 18 is doped overall during or after growth with N-type impurities.

Figure 3D:
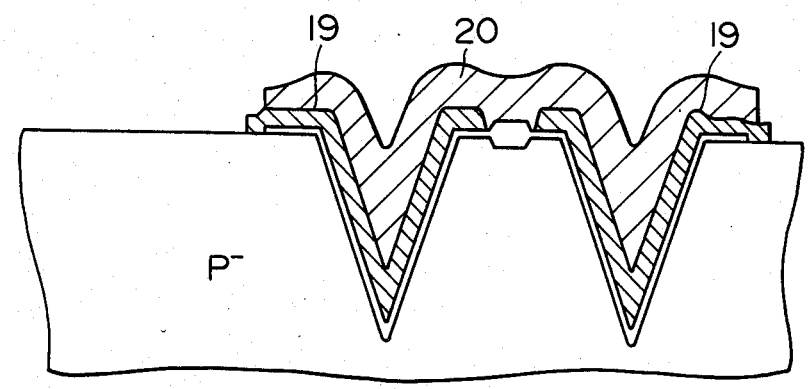

Further, as shown in FIG. 3D, the first layer polycrystalline silicon layer 18 is subjected to CVD (chemical vapor deposition), etc. or the surface of the first layer polycrystalline silicon layer 18 is oxidized so as to form the insulation film 19 as shown by the solid lines in the figure. Then, a second layer polycrystalline silicon layer 20 is formed on the insulation film 19.

Figure 3E:
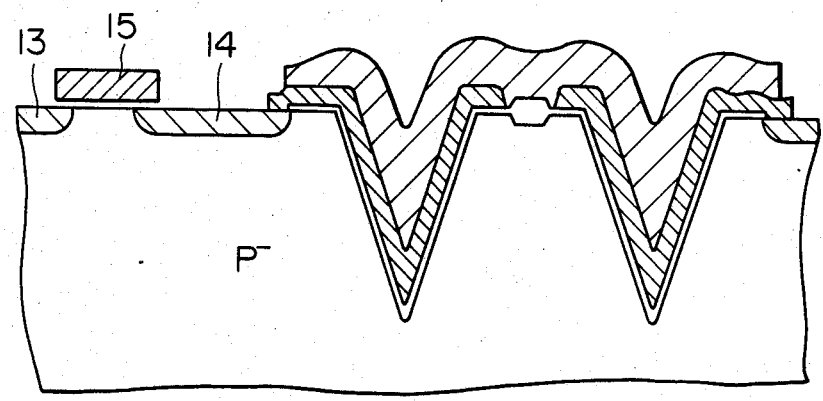

Next, as per FIG. 3E, a thin insulation film is formed on the substrate (not shown), then a third layer polycrystalline silicon layer 15 for forming the gate electrode is formed. Subsequent to this, ion implantation, etc. is performed so as to form N+-type diffusion layers 13 and 14 for the drain and source using the gate electrode as a mask. Thus, the main fabricating processes for the memory cell are completed.

Figure 4:
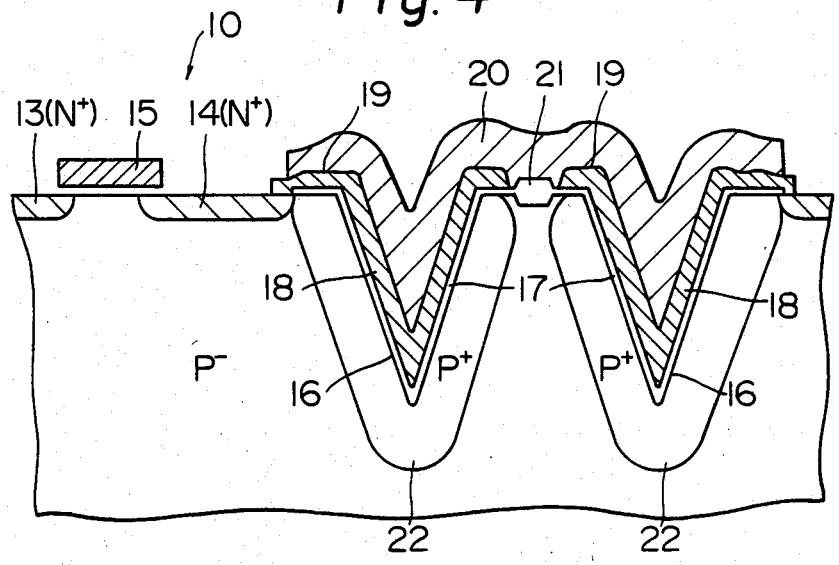
FIG. 4 is a cross-sectional view showing a memory cell used in a semiconductor memory device according to another embodiment of the present invention.

FIG. 4 shows the construction of a memory cell used in a semiconductor memory device according to another embodiment of the present invention. The memory cell of the figure forms a P+-type layer 22 under the groove portion 16 of the semiconductor substrate 12 so as to form a capacitance between the first layer polycrystalline silicon layer 18 and said P+ layer, i.e., the substrate electrode, opposing each other across the insulation layer 17 and uses this capacitance for data storage. By this construction, the capacitance of the capacitor of the memory cell can be made even larger and the data can be stored more reliably. The substrate in this case should be connected to a constant potential node, e.g., a ground terminal, so as to serve as a common capacitor electrode.

If there is no P+ layer, a depletion layer spreads directly under the insulation film 17 and the capacitance between the conductive layer 18 and the substrate electrode becomes equivalent to a series connection of the capacitance of the insulation film 17 and the capacitance of the depletion layer, whereupon a large capacitance cannot be obtained.

Another advantageous effect of the P+ is as follows: In FIG. 2, showing the first embodiment, there is no P+ layer. The problem here is that when the insulation film 17 is thin and a high potential is stored in the conductive layer 18 as information, electric charges in the substrate surface invert and cause a conductive state of the substrate surface with the diffusion layer 14. When this happens, punchthrough occurs with the cells adjoining the inverted substrate surface portion of the groove and information can be easily destroyed. This problem can be improved by introduction of the P+layer so as to make inversion more difficult. Other portions are the same as those of the memory cell of FIG. 2, so an explanation thereof is omitted.

Figure 5A:
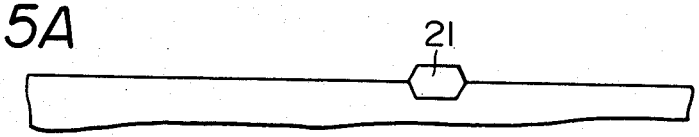
FIG. 5A to FIG. 5G are views of the fabrication process for explaining the method of fabrication of the memory cell of FIG. 4.
Figure 5B:
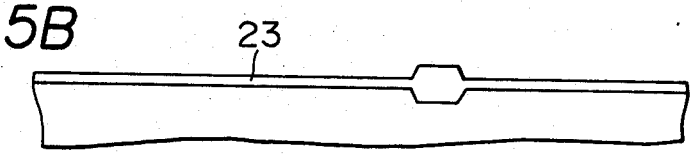

Referring to FIG. 5A to FIG. 5G, an explanation will be made of the method of fabricating the memory cell of FIG. 4. First, as shown in FIG. 5A, a thick field oxide film 21 is formed to electrically isolate the capacitors of memory cells adjoining each other on a semiconductor substrate, then, as shown by FIG. 5B, the entire substrate is covered with an oxide film 23 of, for example, about 1,000 Angstroms.

Figure 5C:
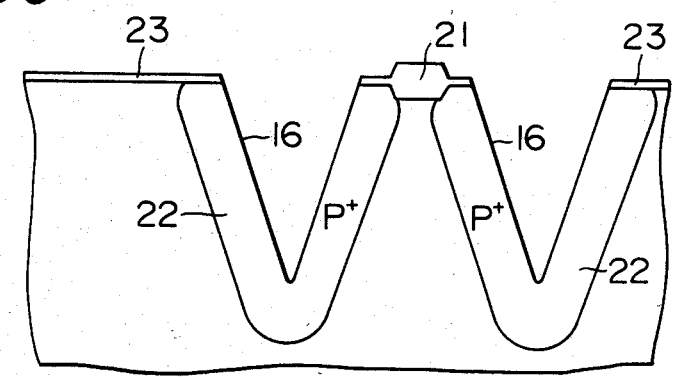

Next, as shown in FIG. 5C, reactive ion etching or other methods are used to form the V-shaped groove 16. This exposes the substrate at the portion of the groove 16. At portions other than the groove 16, the substrate is covered by the insulation film 23 and the field oxide film 21, therefore this insulation film 23 and field oxide film 21 are used as masks for diffusion of boron or the like by vapor growth deposition or other methods on just the portion of the groove 16 so as to form P+-type diffusion layers 22.

Figure 5D:
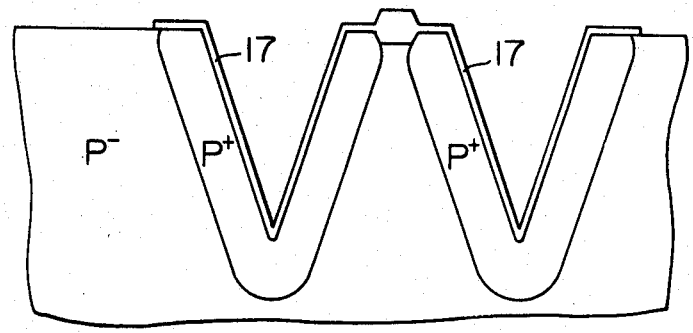

Next, as shown in FIG. 5D, an oxide film (SiO$_2$, etc.) is formed at the portion of the groove 16 as well. Then, the oxide film at portions other than necessary is removed for formation of the insulation film 17.

Figure 5E:
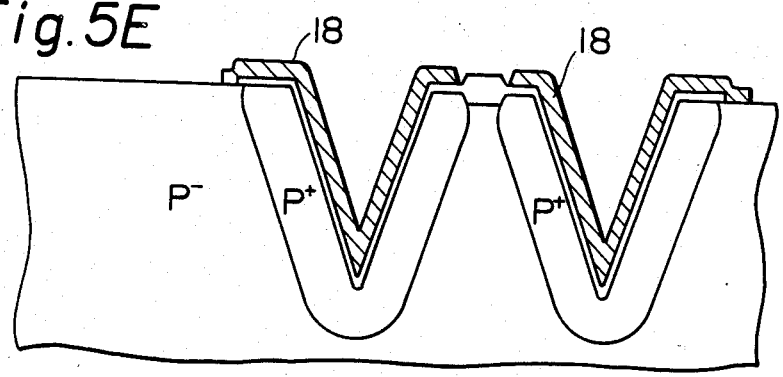
Figure 5F:
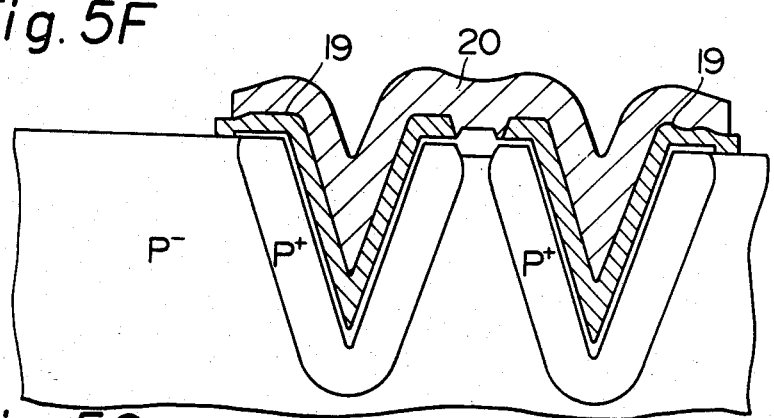
Figure 5G:
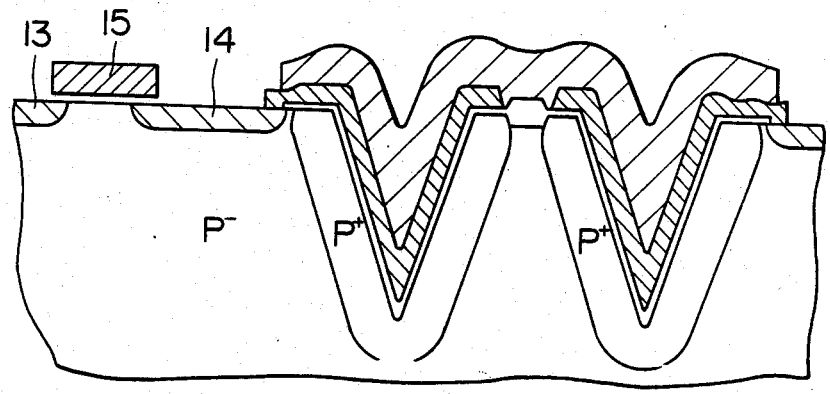

After this, as shown by FIGS. 5E, 5F, and 5G, the first layer conductive layer 18, insulation film 19, second layer conductive layer 20, N+-type diffusion layers 13 and 14, third layer conductive layer 15, etc. are successively formed. These processes are the same as those of FIGS. 3C, 3D, and 3E.

Figure 6:
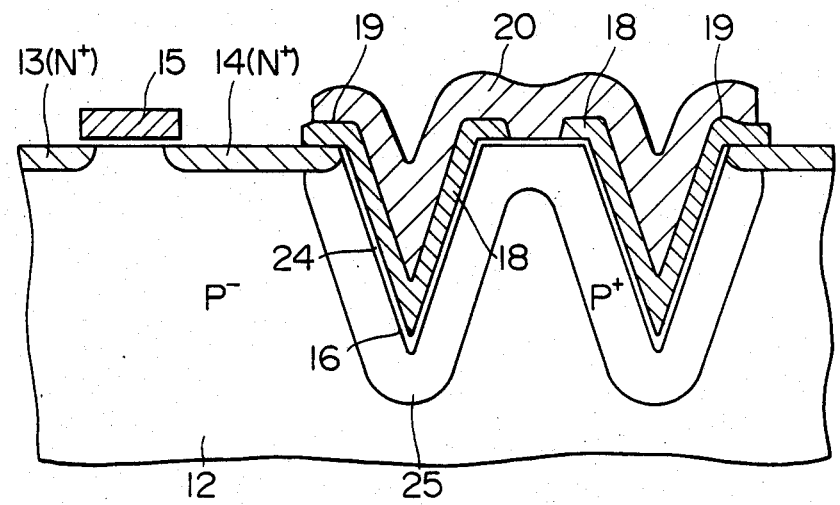
FIG. 6 is a cross-sectional view showing a memory cell used in a semiconductor memory device according to still another embodiment of the present invention.

FIG. 6 shows the constitution of a memory cell used in a semiconductor memory device according to still another embodiment of the present invention. In the memory cell of the figure, the end, on the transfer gate transistor side, of the insulation film 24 formed on the inside surface of the V-shaped groove 16 of the semiconductor substrate 12 does not extend on the top of the substrate 12 and is formed only along the inside surface portion of the V-shaped groove 16. The marginal portion between the end of the source region 14 and the verge of the groove as seen in the preceeding enbodiments is omitted on account of the production process explained later. This makes it possible to reduce the distance between the transfer gate transistor and the V-shaped groove 16 and, thus, to reduce the size of the memory cells. In the memory cell of FIG. 6, a P+-type diffusion layer 25 is formed under the groove 16, etc. to offer a large capacitance with a small occupied area. Further, in the memory cell of FIG. 6, no field oxide film is provided for isolating the capacitors of adjoining memory cells. This enables further reduction of the size of the memory cells. Other portions are the same as in the memory cells of FIG. 2 or FIG. 4 and are shown by the same reference numerals or characters.

Figure 7A:
FIG. 7A to FIG. 7D are views of the fabrication process for explaining the method of fabrication of the memory cell of FIG. 6.

Next, referring to FIGS. 7A to 7D, an explanation will be given of the method for fabricating the memory cell of FIG. 6. First, as shown in FIG. 7A, a nitride film (Si$_3$N$_4$) 26 is formed on a region from the portion of the semiconductor substrate where the transfer gate transistor is to be formed to part of the region of the portion where the V-shaped groove is to be formed.

Figure 7B:
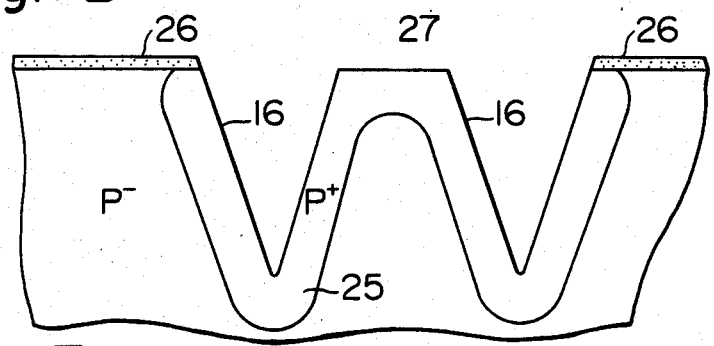
Figure 7C:
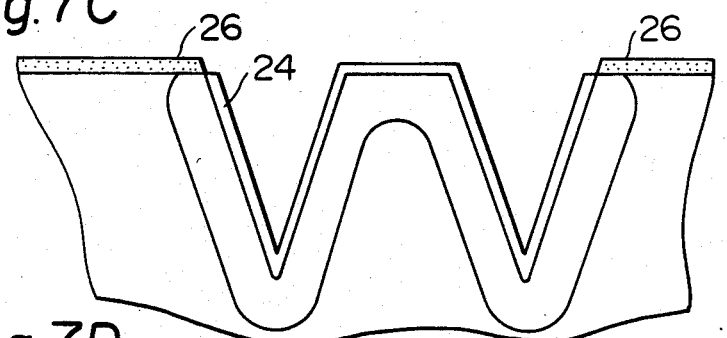
Figure 7D:
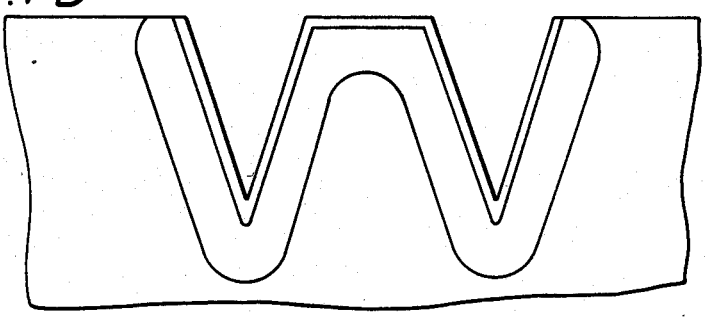

Next, as shown in FIG. 7B, the same method is used to form the V-shaped groove 16. By this, the portion of the groove 16 and the portion 27 between grooves of adjoining memory cells become free of the nitride film 26. Therefore the nitride film 26 is used as a mask for the diffusion of boron, etc. by vapor growth deposition and the formation of a P+ layer 25. Next, vapor growth deposition is utilized for the growth of an oxide film on the grooves 16 and the center portion 27 between grooves. Portions other than this are covered by the nitride film. Since the nitride film does not pass oxygen, these portions are not oxidized. This is shown by FIG. 7C. Next, as shown in FIG. 7D, the nitride film 26 is removed. After this, the same processes as in FIGS. 5E, 5F, and 5G are used for the formation of the memory cell of FIG. 6.

Figure 8:
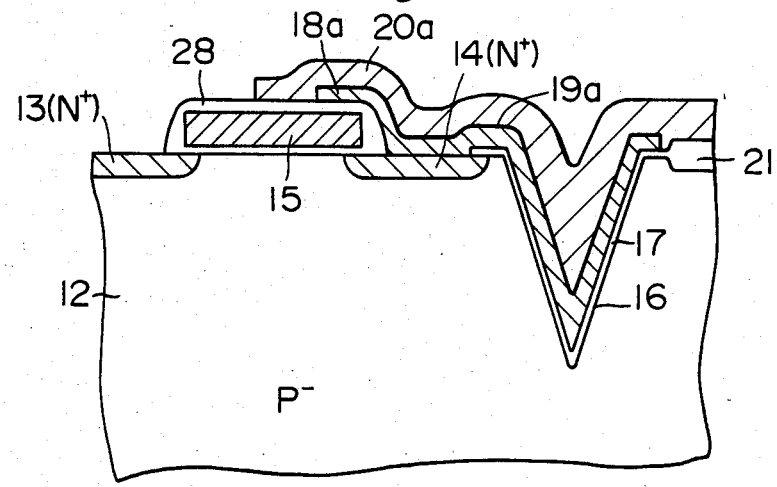
FIGS. 8, 9, 10A, 10B, and 11 are cross-sectional views each showing a memory cell in a semiconductor memory device according to other embodiments of the present invention.

FIG. 8 illustrates a memory cell used in a semiconductor memory device as another embodiment of the present invention. In the memory cell of FIG. 8, a first conductive layer 18a, an insulation film 19a, and a second conductive layer 20a extend over a gate conductive layer 15 via an insulation layer 28. The other portions of FIG. 8 are the same as those of FIG. 2 and are designated by the same reference numerals. According to this embodiment, it is possible to further increase the capacitance of each memory cell and to increase the reliability of data storage.

Figure 9:
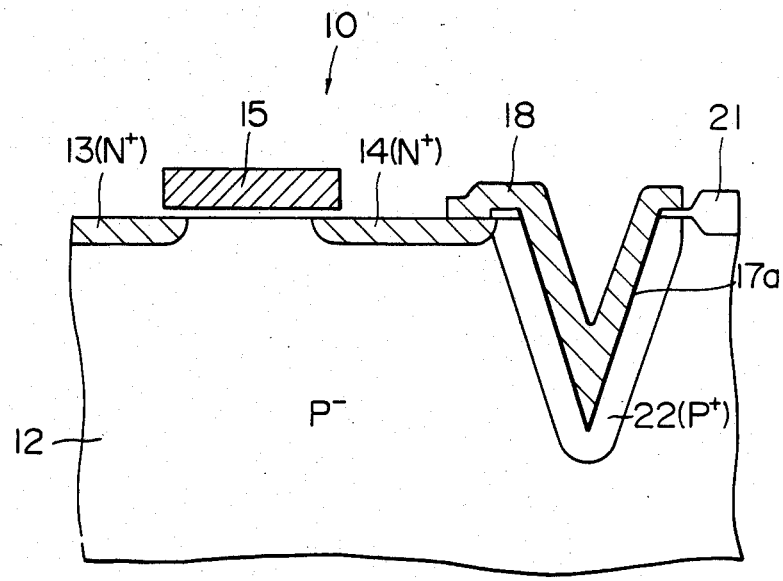

FIG. 9 illustrates a memory cell used in a semiconductor memory device as another embodiment of the present invention. The memory cell of FIG. 9 is substantially the same as that of FIG. 4 except that the memory cell of FIG. 9 does not have the second conductive layer 20 shown in FIG. 4. Therefore, the capacitance for storing data is formed only by the first conductive layer 18 and the P+-type layer 22 formed under the groove portion 16 of the semiconductor substrate opposing each other via the insulation layer 17a. The first conductive layer 18 is electrically coupled to the source 14 of the transfer gate transistor 10 and is used for storing electric charges according to the memorized information. It should be noted that, in the aforementioned memory cell of FIG. 1 used in the conventional memory device, the conductive layer 6 formed on the inside surface of the groove portion is not connected to the source 3 of the transfer gate transistor, but is connected to a power source or the ground. That is, in the memory cell of FIG. 1, the common electrode of the capacitor is the conductive layer 6, while, in the memory cell of FIG. 9, the common electrode of the capacitor is the P+-type layer 22 of the substrate 12.

Figure 10A:
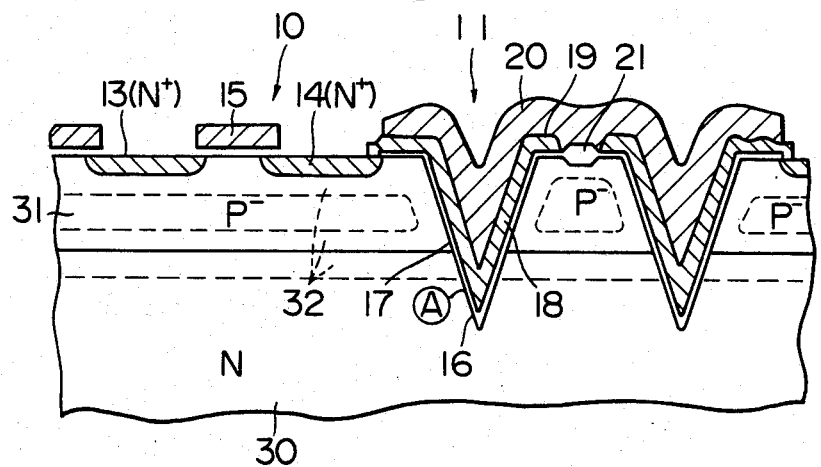
Figure 10B:
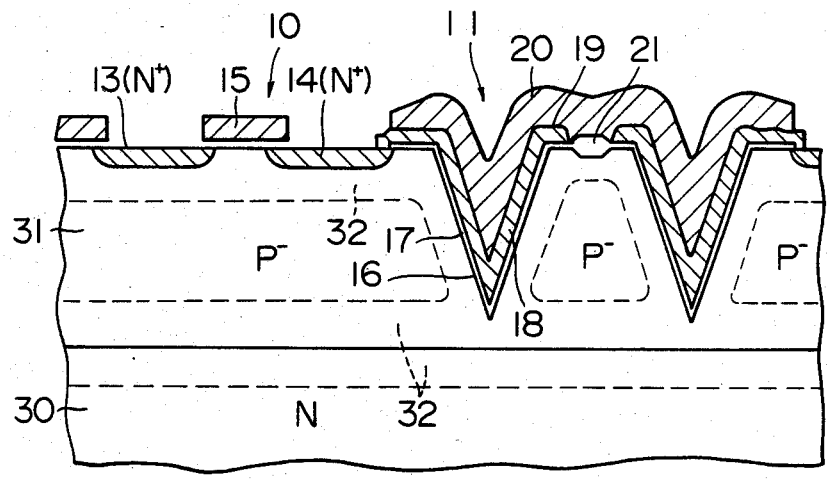

FIGS. 10A and 10B illustrate memory cells used in semiconductor memory devices as other embodiments of the present invention, respectively. In each of the figures, a semiconductor substrate 30 has the N-type conductivity which is the same as that of the drain 13 and the source 14 of the transfer gate transistor 10. On the N-type substrate 30 is formed a P$^-$-type semiconductor layer 31 having opposite conductivity type to that of the substrate. The P$^-$-type semiconductor layer 31 is formed by, for example, epitaxial growth or ion implantation, and has the thickness of, for example, 2 to 3 microns. The drain 13 and the source 14 are formed on the P⁻-type semiconductor layer 31. The capacitor of the memory cell is formed on a V-shaped groove 16 formed from the surface of the semiconductor layer 31 toward the substrate 30, and has the same structure as that of the memory cell of FIG. 2.

Between the P⁻-type semiconductor layer 31 and the N-type substrate 30 is added a reverse biased voltage. For example, to the N-type substrate 30 a voltage $V_{cc}$ is supplied, i.e., +5 V, and to the P⁻-type semiconductor 31 a voltage $V_{ss}$ is supplied, i.e., 0 V or $V_{bb}$, i.e., −2 to −3 V.

The only difference between the memory cells of FIGS. 10A and 10B is that the bottom of the groove 16 reaches the N-type substrate 30 through the P⁻-type layer 31 in FIG. 10A, but does not reach the N-type substrate 30 in FIG. 10B.

In the memory cell of FIG. 10A or 10B, when information "1", i.e., the high level potential $V_{cc}$, is stored in the capacitor 11, the potential of the first conductive layer 18 and the N⁺-type diffusion layer 14 connected to the first conductive layer 18 is the high level $V_{cc}$. The P⁻-type semiconductor layer 31 and the N-type substrate 30 are kept in a reverse biased condition as mentioned before. Therefore, as shown by dotted lines, the depletion layer 32 is formed along the surface of the P⁻-type semiconductor layer 31, i.e., under the area of the N⁺ diffusion layer 14, and under the insulating film 17 on which the conductive layer 18 is arranged. The depletion layer 32 is also formed along the boundary of the P⁻-type semiconductor layer 31 and the N-type substrate 30.

In such a condition, if alpha particles are radiated to the memory cell and electrons are generated in the depletion region under the N⁺-type diffusion layer 14, the electrons flow into the diffusion layer 14. However, if alpha rays are radiated into the groove portion and electrons are generated in the depletion region under the insulation film 17, the electrons move along the electric field of the depletion region and are gathered at the boundary surface of the groove 16. A part of the electrons in the boundary surface of the groove 16 flows into the N-type substrate 30 whose potential is high, e.g., $V_{cc}$, along the boundary surface. Therefore, although a part of the electrons in the boundary surface flows into the N⁺-type diffusion layer 14, the quantity of the electrons flowing into the N⁺-type diffusion layer 14 is much decreased, and the probability of the destruction of data stored in the memory cell is greatly decreased.

It should be noted that, in order to pass the electrons in the depletion region into the N-type substrate 30, it is necessary that the depletion region formed along the boundary of the P⁻-type semiconductor layer 31 and the N-type substrate 30 be in contact with at least a part of the groove 16.

Figure 11:
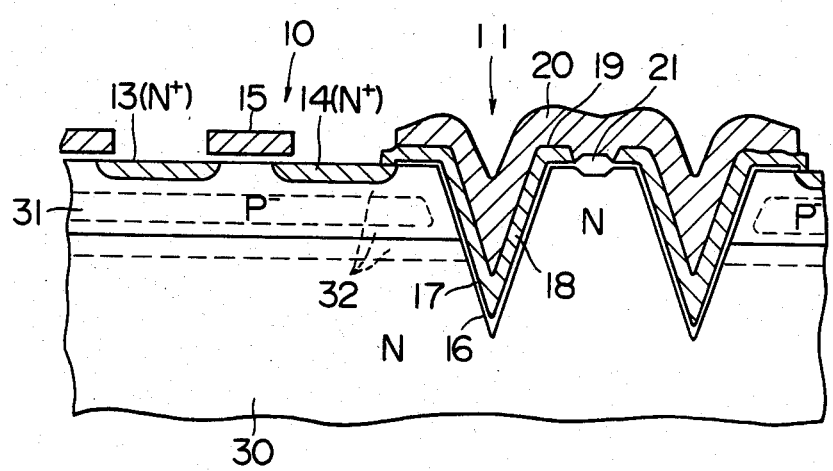

FIG. 11 illustrates a memory cell used in a semiconductor memory device as another embodiment of the present invention. In the memory device of FIG. 11, the above-mentioned P⁻-type semiconductor layer is not formed in the intermediate portion of the grooves of the mutually adjoining memory cells. Therefore, electrons generated by the alpha particles radiated into the intermediate portion are mostly absorbed by the N-type substrate 30, and the number of electrons flowing into the N⁺-type diffusion layer 14 is generally decreased. Moreover, since the depletion layer is not formed in the intermediate portion, the capacitance between the first conductive layer 18 and the N-type substrate becomes great, thereby increasing the stability of data storage.

As explained above, the present invention provides a semiconductor memory device having memory cells with groove-type capacitors and transfer gate transistors, wherein the electrode of a groove-type capacitor connected to the source of a transfer gate transistor is formed on an insulation film attached to the inside surface of a groove formed in the substrate, eliminating the punchthrough phenomenon, etc. between the grooves of capacitors of adjoining memory cells and therefore enabling reduction of the distance between the grooves and a higher degree of integration. Further, it prevents the occurrence of leakage at groove portions due to stress induced by heat treatment, etc. in the fabrication processes and thus improves the reliability of the memory device. Moreover, the present invention provides a semiconductor memory device which can store data stably and reliably without being affected by the radiation of alpha particles.

I claim:

1. A semiconductor memory device comprising a plurality of memory cells provided with a semiconductor substrate of a first conductivity type, each said memory cell including:
   a groove in said substrate and a first insulation film on the surface of said groove;
   a transfer gate transistor having a drain region and a source region formed in said substrate with a channel region therebetween, and a gate formed on a gate insulation film on said channel region; and
   a capacitor including
      a first conductive layer on said first insulation film, said first conductive layer being electrically coupled to the source region of said transfer gate transistor,
      a high impurity concentration layer formed in said substrate adjacent said groove, of the same conductivity type as that of said substrate.

2. A semiconductor memory device according to claim 1, wherein each said capacitor further comprises a second insulation film on said first conductive layer and a second conductive layer on said second insulation film, and a significant part of the capacitance of said capacitor is effectively due to said first and second conductive layers as separated by said second insulation film.

3. A semiconductor memory device according to claim 1 or 2, wherein said high impurity concentration layer is separately formed for each said memory cell.

4. A semiconductor memory device according to claim 1 or 2, wherein said high impurity concentration layer is formed in common for respective adjoining ones of said memory cells.

5. A semiconductor memory device comprising a plurality of memory cells provided with a semiconductor substrate of a first conductivity type, each said memory cell including:
   a groove in said substrate and a first insulation film on the surface of said groove;
   a transfer gate transistor having a drain region and a source region formed in said substrate with a channel region therebetween, and a gate formed on a gate insulation film on said channel region; and
   a capacitor including
      a first conductive layer on said first insulation film, said first conductive layer being electrically coupled to the source region of said transfer gate transistor, and a second insulation film on said first conductive layer and a second conductive layer on said second insulation film;

said semiconductor device further comprising a field oxide on the surface of said substrate between the grooves of respective adjacent ones of said memory cells;

wherein both said first and second conductive layers and second insulation film of each said memory cell extend over said gate of said transfer gate transistor of the respective memory cell, each said first insulation layer is thinner than said field oxide, and a significant part of the capacitance of said capacitor is effectively due to said first and second conductive layers as separated by said second insulating film.

6. A semiconductor memory device according to claim 2, wherein said first and second conductive layer and said second insulation film extend over said gate of said transfer gate transistor of the respective memory cell.

7. A semiconductor memory device comprising a plurality of memory cells provided with a semiconductor substrate of a first conductivity type having a semiconductor layer formed thereon of a conductivity type opposite to said first conductivity type, each said memory cell including:

a groove in said semiconductor layer and a first insulation film on the surface of said groove;

a transfer gate transistor having a drain region and a source region formed in said semiconductor layer with a channel region therebetween, and a gate formed on a gate insulation film on said channel region;

a capacitor including
 a first conductive layer on said first insulating film, said first conductive layer being electrically coupled to said source region of said transfer gate transistor, and said semiconductor memory device further comprising means for reversely biasing a PN junction formed by said semiconductor layer and said substrate of opposite conductivity types to form a depletion region extending under each said transfer gate transistor and at least a part of said groove of each said memory cell.

8. A semiconductor memory device according to claim 7, wherein the groove of each said memory cell extends through said semiconductor layer into said semiconductor substrate.

9. A semiconductor memory device according to claim 7, wherein the groove of each said memory cell terminates within said semiconductor layer, and said depletion region formed along said PN junction as a result of the reverse bias extends to at least a part of said groove.

10. A semiconductor memory device according to claim 9, wherein said semiconductor layer of said substrate is not present in a respective area between the grooves of respective ajoining ones of said memory cells, in which area said semiconductor substrate of said first conductivity type extends to said first insulation films.

11. The device of claim 1, 2, 5, 6, 7, 8, 9 or 10, comprising a field oxide on the surface of said substrate, between the grooves of respective adjacent ones of said memory cells.

12. The device of claim 3, comprising a field oxide on the surface of said substrate, between the grooves and high impurity concentration layers of respective adjacent ones of said memory cells.

13. The device of claim 4, said first insulation film being the only insulation layer at the surface of said substrate between the grooves of respective adjacent ones of said memory cells.

14. The device of claim 2, 5, 6, 7, 8, 9 or 10, said second conductive layer extending in common between the grooves of respective adjacent ones of said memory cells.

15. The semiconductor memory device of claim 5, wherein said second conductive layer extends further onto said gate of said transfer gate transistor than said first conductive layer, and is insulated from said gate.

16. The semiconductor memory device of claim 1, wherein the capacitance of said capacitor is effectively provided by said high impurity concentration layer and said first conductive layer as separated by said first insulation film.

17. The semiconductor memory device of claim 7, 8, 9 or 10, each said memory cell comprising a second insulation film on said first conductive layer and a second conductive layer on said second insulation film, wherein the capacitance of each said capacitor is effectively provided by said first and second conductive layers as separated by said second insulation layer.

* * * * *